(12) United States Patent
Tang et al.

(10) Patent No.: US 12,411,375 B2
(45) Date of Patent: Sep. 9, 2025

(54) ARRAY SUBSTRATE AND PREPARATION METHOD THEREOF AS WELL AS TOUCH DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Liangzhen Tang, Beijing (CN); Xianglei Qin, Beijing (CN); Xing Xu, Beijing (CN); Yong Zhang, Beijing (CN); Jian Wang, Beijing (CN); Wulin Zhang, Beijing (CN); Zhaohu Yu, Beijing (CN); Pingyuan Sun, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/274,182

(22) PCT Filed: Sep. 29, 2022

(86) PCT No.: PCT/CN2022/122842
§ 371 (c)(1),
(2) Date: Jul. 25, 2023

(87) PCT Pub. No.: WO2024/065482
PCT Pub. Date: Apr. 4, 2024

(65) Prior Publication Data
US 2025/0231436 A1    Jul. 17, 2025

(51) Int. Cl.
*G02F 1/1333*     (2006.01)
*G02F 1/1362*     (2006.01)
(Continued)

(52) U.S. Cl.
CPC .... *G02F 1/13338* (2013.01); *G02F 1/136209* (2013.01); *G02F 1/136286* (2013.01);
(Continued)

(58) Field of Classification Search
None
See application file for complete search history.

(56) References Cited

U.S. PATENT DOCUMENTS

2012/0249436 A1*  10/2012  Choi .................... G06F 3/0446
                                                        445/24
2018/0299985 A1*  10/2018  Wang .................. G06F 3/04166
(Continued)

FOREIGN PATENT DOCUMENTS

CN    105957870 A    9/2016
CN    205679878 U   11/2016
(Continued)

*Primary Examiner* — Nicholas J Lee
(74) *Attorney, Agent, or Firm* — Myers Bigel, P.A.

(57) ABSTRACT

This disclosure provides an array substrate and a preparation method thereof as well as a touch display device. The array substrate includes: a substrate; a plurality of gate lines and a plurality of data lines located on the substrate, wherein the plurality of gate lines extend along a first direction and are arranged in a second direction different from the first direction, the plurality of data lines extend in the second direction and are arranged in the first direction, the plurality of gate lines intersect with the plurality of data lines to define a plurality of pixel areas; and a plurality of touch signal lines located on the substrate, wherein the plurality of touch signal lines extend in the second direction, each of the plurality of touch signal lines comprises a lower touch signal line and an upper touch signal line, and an edge of the upper touch
(Continued)

signal line is spaced apart from an edge of the lower touch signal line in the first direction.

20 Claims, 15 Drawing Sheets

(51) Int. Cl.
*G06F 3/041* (2006.01)
*H10D 86/01* (2025.01)
*H10D 86/40* (2025.01)

(52) U.S. Cl.
CPC ........ *G06F 3/0412* (2013.01); *G06F 3/04164* (2019.05); *H10D 86/021* (2025.01); *H10D 86/441* (2025.01); *G06F 2203/04103* (2013.01)

(56) References Cited

U.S. PATENT DOCUMENTS

| | | | |
|---|---|---|---|
| 2018/0341353 A1* | 11/2018 | Zhang | G06F 3/0446 |
| 2019/0042047 A1* | 2/2019 | Liao | H10D 86/60 |
| 2019/0056830 A1* | 2/2019 | Li | G06F 3/0412 |
| 2019/0235294 A1 | 8/2019 | Wang et al. | |
| 2021/0018781 A1* | 1/2021 | Chen | G02F 1/13338 |
| 2022/0107706 A1 | 4/2022 | Lu | |

FOREIGN PATENT DOCUMENTS

| | | |
|---|---|---|
| CN | 106773227 A | 5/2017 |
| CN | 107132710 A | 9/2017 |
| CN | 107807756 A | 3/2018 |
| CN | 108227326 A | 6/2018 |
| CN | 216052544 U | 3/2022 |

\* cited by examiner

ARRAY SUBSTRATE AND PREPARATION METHOD THEREOF AS WELL AS TOUCH DISPLAY DEVICE

RELATED APPLICATIONS

The present application is a U.S.C. 371 national stage application of PCT International Application No. PCT/CN2022/122842, filed on Sep. 29, 2022, the entire disclosure of which is incorporated herein by reference.

FIELD

This disclosure relates to the field of display technology, particularly, to an array substrate and a preparation method thereof as well as a touch display device.

BACKGROUND

Touch display screens have been widely used in various electronic products. Touch Display Driver Integration (TDDI) products use time-division multiplexing of common electrodes for touch driving. That is, the common electrode of the display area is divided into a plurality of touch sensing units (i.e. touch electrodes) and connected to the touch control circuit (IC) through a touch signal line passing through the display area. In the display stage, the touch sensing unit can serve as a common electrode to output a common signal (Vcom signal); in the touch sensing stage, the touch sensing unit serves as a touch electrode to sense the touch of the fingers. Finger touch can lead to an increase in the capacitance of the touch sensing unit to the ground at the corresponding position. By detecting changes in the capacitance of the touch sensing unit, the IC can identify the position where touch occurs.

The layout of the source signal pad and touch signal pad of TDDI products includes two designs: referring to FIG. 1A, the touch signal pad is arranged on one side of the source signal pad and forms a separate row. According to this design, the source signal fan out line and the touch signal fan out line can share a same metal layer (such as the source drain layer) for wiring, without the need to design a separate metal layer for wiring the touch signal fan out line, as shown in FIG. 1B. Referring to FIG. 1C, the touch signal pad is arranged on both sides of the source signal pad. According to this design, there is an overlap between the source signal fan out line and the touch signal fan out line, and the same metal layer cannot be used for wiring. A separate metal layer needs to be designed for wiring the touch signal fan out line, as shown in FIGS. 1D and 1E.

SUMMARY

This disclosure provides an array substrate and a preparation method thereof as well as a touch display device, to ensure the normal orientation of the liquid crystal sandwiched between the array substrate and the opposite substrate after assembling, and to avoid the occurrence of poor light leakage at the pixel edges.

According to an aspect of this disclosure, an array substrate is provided, comprising: a substrate; a plurality of gate lines and a plurality of data lines positioned on the substrate, wherein the plurality of gate lines extend along a first direction and are arranged in a second direction different from the first direction, the plurality of data lines extend in the second direction and are arranged in the first direction, the plurality of gate lines intersect with the plurality of data lines to define a plurality of pixel areas; and a plurality of touch signal lines positioned on the substrate, wherein the plurality of touch signal lines extend in the second direction, each of the plurality of touch signal lines comprises a lower touch signal line and an upper touch signal line, the lower touch signal line is positioned in a same layer as the plurality of data lines, the upper touch signal line is positioned above the lower touch signal line in a direction perpendicular to the array substrate. Each touch signal line is adjacent to one of the plurality of data lines. The lower touch signal line comprises a first lower edge and a second lower edge extending along the second direction. A distance from the first lower edge to the adjacent data line in the first direction is less than a distance from the second lower edge to the adjacent data line in the first direction. The upper touch signal line comprises a first upper edge and a second upper edge extending along the second direction. A distance from the first upper edge to the adjacent data line in the first direction is less than a distance from the second upper edge to the adjacent data line in the first direction. A distance from the second upper edge of the upper touch signal line to the adjacent data line in the first direction is less than a distance from the second lower edge of the lower touch signal line to the adjacent data line in the first direction.

In some embodiments, a distance from the first upper edge of the upper touch signal line to the adjacent data line in the first direction is essentially the same as a distance from the first lower edge of the lower touch signal line to the adjacent data line in the first direction.

In some embodiments, a width of the upper touch signal line in the first direction is essentially the same as a width of the lower touch signal line in the first direction.

In some embodiments, a width of the upper touch signal line in the first direction is greater than a width of the lower touch signal line in the first direction.

In some embodiments, the array substrate further comprises a first overlapping electrode. The upper touch signal line and the lower touch signal line of each of the plurality of touch signal lines are electrically connected to each other via the first overlapping electrode.

In some embodiments, the array substrate comprises a display area and a non-display area adjacent to each other, and an upper via hole connected to the upper touch signal line and a lower via hole connected to the lower touch signal line are formed at positions of the non-display area close to the display area. The first overlapping electrode is electrically connected to the upper touch signal line and the lower touch signal line via the upper via hole and the lower via hole, so that the upper touch signal line and the lower touch signal line are electrically connected to each other.

In some embodiments, the upper via hole and the lower via hole are aligned in the first direction.

In some embodiments, the plurality of touch signal lines comprise valid touch signal lines and dummy touch signal lines, and the dummy touch signal lines are electrically connected to a common signal line via the first overlapping electrode.

In some embodiments, the array substrate further comprises a plurality of touch electrodes. The first overlapping electrode, the plurality of touch electrodes and the common signal line are arranged in a same layer, and each of the valid touch signal lines is electrically connected to one of the plurality of touch electrodes respectively in the display area.

In some embodiments, the non-display area comprises a plurality of touch signal leads, a plurality of upper source signal leads and a plurality of lower source signal leads, and the plurality of data lines comprise a plurality of first data lines and a plurality of second data lines. The plurality of touch signal leads are arranged in a same layer as the upper touch signal lines of the plurality of touch signal lines, and are respectively connected and extended with the upper touch signal lines of the plurality of touch signal lines. The plurality of upper source signal leads are arranged in a same layer as the lower touch signal lines of the plurality of touch signal lines, and are respectively connected and extended with the plurality of first data lines. The plurality of lower source signal leads are positioned below the plurality of upper source signal leads in a direction perpendicular to the array substrate, and each of the plurality of lower source signal leads is electrically connected to one of the plurality of second data lines.

In some embodiments, at positions of the non-display area close to the display area, a data line via hole connected to the second data line and a source line via hole connected to the lower source signal lead are formed. Each of the plurality of lower source signal leads is electrically connected to one of the plurality of second data lines respectively via the source line via hole, a second overlapping electrode and the data line via hole, wherein the first overlapping electrode and the second overlapping electrode are arranged in a same layer.

In some embodiments, a distance between at least two adjacent data lines in the plurality of data lines is different from a distance between other adjacent data lines.

In some embodiments, the substrate comprises a first substrate. A gate insulating layer is arranged on the first substrate. The plurality of data lines and the lower touch signal lines of the plurality of touch signal lines are arranged on the gate insulating layer, and the array substrate further comprises a passivation layer formed on the gate insulating layer, wherein the passivation layer covers the plurality of data lines and the plurality of touch signal lines.

In some embodiments, the array substrate further comprises a plurality of pixel electrodes. The plurality of pixel electrodes are arranged in the plurality of pixel areas respectively, and the plurality of pixel electrodes are arranged in a same layer as the plurality of data lines and the lower touch signal lines of the plurality of touch signal lines. The passivation layer covers the plurality of pixel electrodes.

According to another aspect of this disclosure, a touch display device is provided, comprising an array substrate according to this disclosure and an opposite substrate opposite to the array substrate.

In some embodiments, the opposite substrate comprises a black matrix layer. A portion of the pixel area exposed by the black matrix layer is an opening area. A distance from the second upper edge of the upper touch signal line to an edge of the opening area in the first direction is greater than a distance from the second lower edge of the lower touch signal line to the edge of the opening area in the first direction.

In some embodiments, a distance from the edge of the opening area to the second upper edge of the upper touch signal line is greater than or equal to 3 μm.

According to a further aspect of this disclosure, a preparation method of an array substrate is provided, comprising: preparing a substrate; preparing a plurality of gate lines and a plurality of data lines on the substrate, wherein the plurality of gate lines extend along a first direction and are arranged in a second direction different from the first direction, the plurality of data lines extend in the second direction and are arranged in the first direction, the plurality of gate lines intersect with the plurality of data lines to define a plurality of pixel areas; and preparing a plurality of touch signal lines on the substrate, wherein the plurality of touch signal lines extend in the second direction, each of the plurality of touch signal lines comprises a lower touch signal line and an upper touch signal line, the lower touch signal line is positioned in a same layer as the plurality of data lines, the upper touch signal line is positioned above the lower touch signal line in a direction perpendicular to the array substrate. Each touch signal line is adjacent to one of the plurality of data lines. The lower touch signal line comprises a first lower edge and a second lower edge extending along the second direction. A distance from the first lower edge to the adjacent data line in the first direction is less than a distance from the second lower edge to the adjacent data line in the first direction. The upper touch signal line comprises a first upper edge and a second upper edge extending along the second direction. A distance from the first upper edge to the adjacent data line in the first direction is less than a distance from the second upper edge to the adjacent data line in the first direction. A distance from the second upper edge of the upper touch signal line to the adjacent data line in the first direction is less than a distance from the second lower edge of the lower touch signal line to the adjacent data line in the first direction.

DETAILED DESCRIPTION OF THE DRAWINGS

The accompanying drawings are used to provide a further understanding of the embodiments of this disclosure and constitute a part of the description. Together with the embodiments of this disclosure, they are used to explain this disclosure and do not constitute a limitation of this disclosure. By referring to the accompanying drawings to describe the detailed exemplary embodiments, the above and other features and advantages will become more apparent to those skilled in the art, in the accompanying drawings.

EMBODIMENTS

In order to make those skilled in the art understand the technical solution of this disclosure better, a detailed description of the array substrate and the preparation method thereof as well as the touch display device provided by this disclosure will be given below in conjunction with the accompanying drawings.

In the following text, the exemplary embodiments will be described more fully with reference to the accompanying drawings, but these exemplary embodiments can be embodied in different forms and should not be limited to the embodiments described herein. On the contrary, the purpose of providing these embodiments is to make this disclosure thorough and complete, and to enable those skilled in the art to fully understand the scope of this disclosure.

Without conflict, the embodiments of this disclosure and features in the embodiments can be combined with each other.

As used herein, the term "and/or" includes any and all combinations of at least one related enumeration entry.

The terms used herein are only used to describe specific embodiments and are not intended to limit this disclosure. As used herein, the singular forms "a" and "the" are also intended to include the plural form, unless otherwise clearly indicated in the context. It will also be understood that when the terms "including" and/or "made of" are used in this description, the presence of said features, whole, step, operation, element, and/or component is specified, but it is not excluded that at least one other feature, whole, step, operation, element, component, and/or group thereof exists or is added.

Unless otherwise limited, all terms used herein (including technical and scientific terms) have the same meanings as those commonly understood by those ordinary skilled in the art. It will also be understood that terms such as those limited in commonly used dictionaries should be interpreted as having meanings consistent with their meanings in the relevant technology and the context of this disclosure, and will not be interpreted as having idealized or overly formal meanings, unless explicitly limited herein.

The driving frequency of the touch signal refers to the frequency of the square wave of the touch signal emitted through the IC. A higher driving frequency is better, because the noise in the higher frequency band is usually smaller. According to the IC specifications (i.e. IC driving capability, number of supported touch signal channels, etc.) and the product specifications (i.e. pixel size, resolution, opening rate, etc.), it is necessary to balance the driving frequency and pixel opening rate to reasonably design the line width of the touch signal line. The wider the line width of the touch signal is, the smaller its resistance will be, and thus the higher the driving frequency will be. However, a wider touch signal line can affect the pixel opening rate, resulting in a smaller pixel opening rate.

Figure 2A:
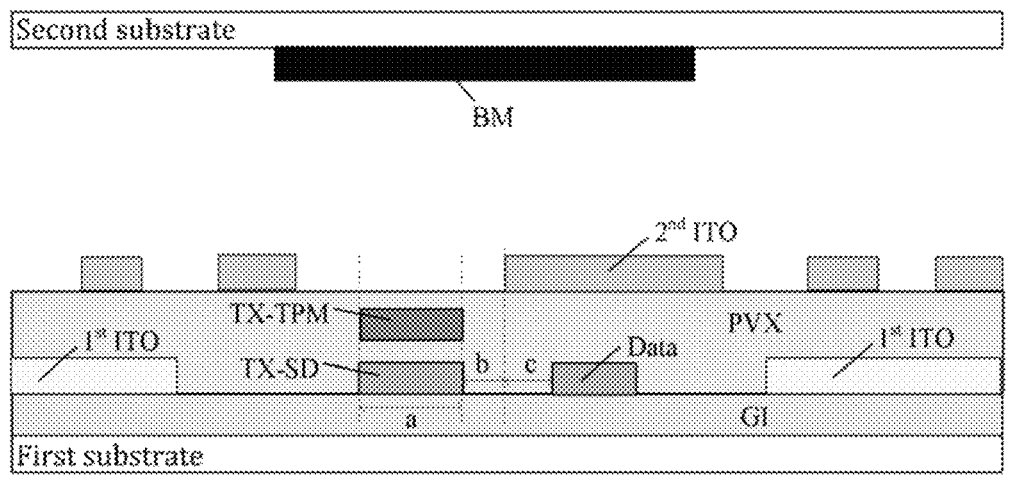
FIG. 2A shows the layout of touch signal lines arranged in layers in related technologies.

A method of arranging the touch signal lines in layers without increasing the width of the touch signal lines is proposed to reduce the resistance of the touch signal lines and increase the driving frequency of touch signals. The upper touch signal line and the touch signal fan out line of the non-display area are arranged in the same layer, while the lower touch signal line and the source drain metal layer of the non-display area are arranged in the same layer. FIG. 2A shows a layout of the touch signal lines arranged in layers. Refer to FIG. 2A, the upper touch signal line TX-TPM and the lower touch signal line TX-SD are designed in layers in a directly face-to-face manner. This directly face-to-face design can achieve a larger spacing between the Touch Pattern Metal (TPM) and the adjacent touch electrode. The touch electrode is obtained by dividing the common electrode (Vcom electrode) into a plurality of touch sensing units. The materials used to form the common electrode include, for example, indium tin oxide (ITO).

Due to the need for the actual display effect of the product, the upper ITO (i.e. $2^{nd}$ ITO shown in FIG. 2A) needs to cover the data line Data and exceed a certain distance, i.e. distance c shown in FIG. 2A. The lower touch signal line TX-SD and the data line Data are arranged in the same layer as the source drain (SD) metal layer.

Figure 2B:
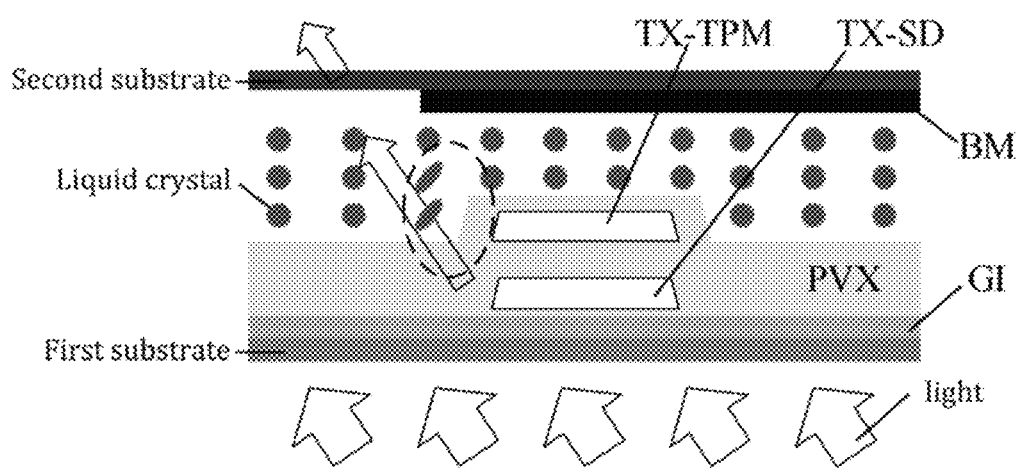
FIG. 2B is a schematic diagram of the mechanism of abnormal liquid crystal orientation caused by touch signal lines arranged in layers in related technologies.

When preparing the array substrate, each layer is aligned with the gate layer, that is, the TPM layer will be aligned with the gate layer, and the ITO layer will also be aligned with the gate layer. During both alignment processes, there will be process fluctuations, resulting in a certain deviation between the distance between the actually prepared upper touch signal line TX-TPM and the upper ITO and the design value. If the design distance between the upper touch signal line TX-TPM and the upper ITO is insufficient, after actual fabrication, the upper ITO and the upper touch signal line TX-TPM may overlap, generating overlapping capacitances, resulting in a decrease in the driving frequency of the touch signal. According to the design shown in FIG. 2A, it is not necessary to consider the overlapping capacitance generated by overlapping of the upper ITO and the upper touch signal line TX-TPM due to alignment issues between the upper ITO and the upper touch signal line TX-TPM. However, this design will result in a large slope angle at the edge of the passivation layer PVX covering the touch signal line (see the dashed line portion in FIG. 2B), resulting in abnormal orientation of the liquid crystal at the edge and easy occurrence of poor light leakage. FIG. 2B is a schematic diagram of the mechanism of abnormal liquid crystal orientation.

In order to effectively solve the above problems in related technologies, the technical solution of this disclosure is proposed so that the touch signal lines arranged in layers do not cause a large slope angle of the passivation layer covering it, ensure the normal orientation of the liquid crystal sandwiched between the array substrate and the opposite substrate after assembling, and avoid the phenomenon of poor light leakage at the pixel edge.

Figure 3A:
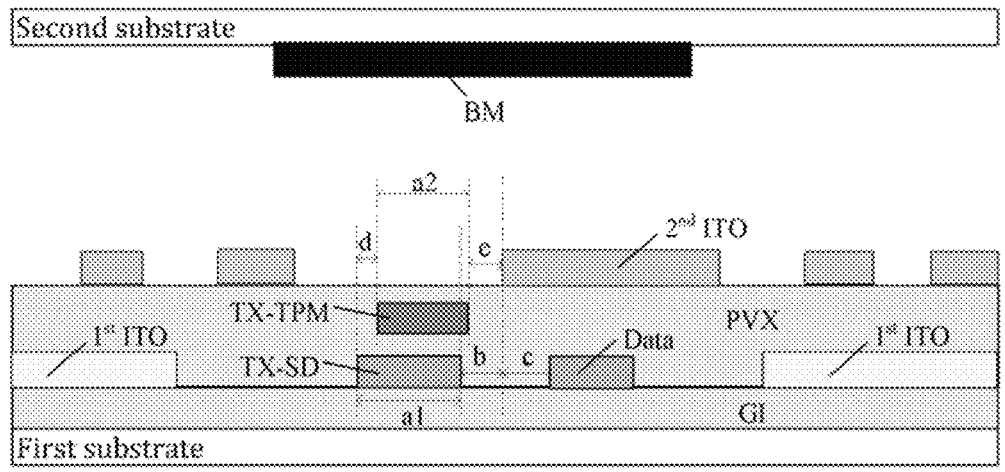
FIG. 3A shows a layout of touch signal lines arranged in layers according to an embodiment of this disclosure.
Figure 3B:
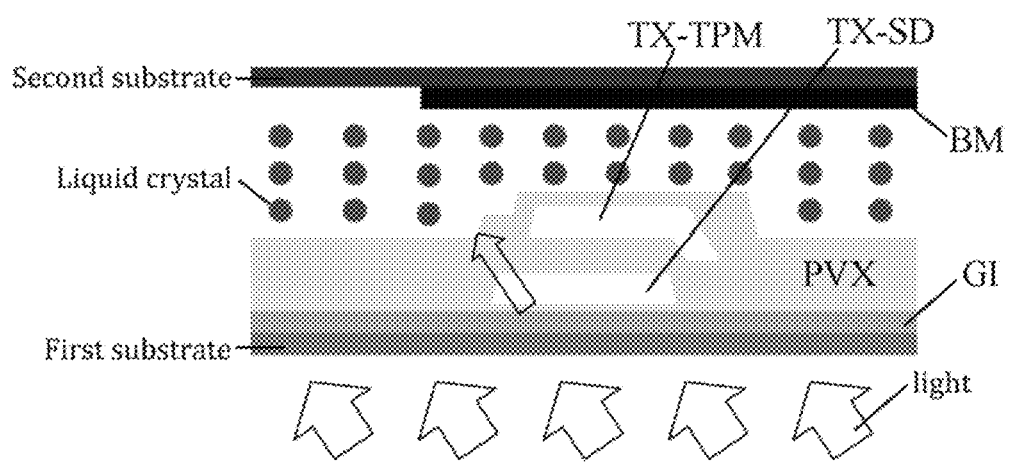
FIG. 3B is a schematic diagram of improving abnormal liquid crystal orientation by touch signal lines arranged in layers according to an embodiment of this disclosure.
Figure 4:
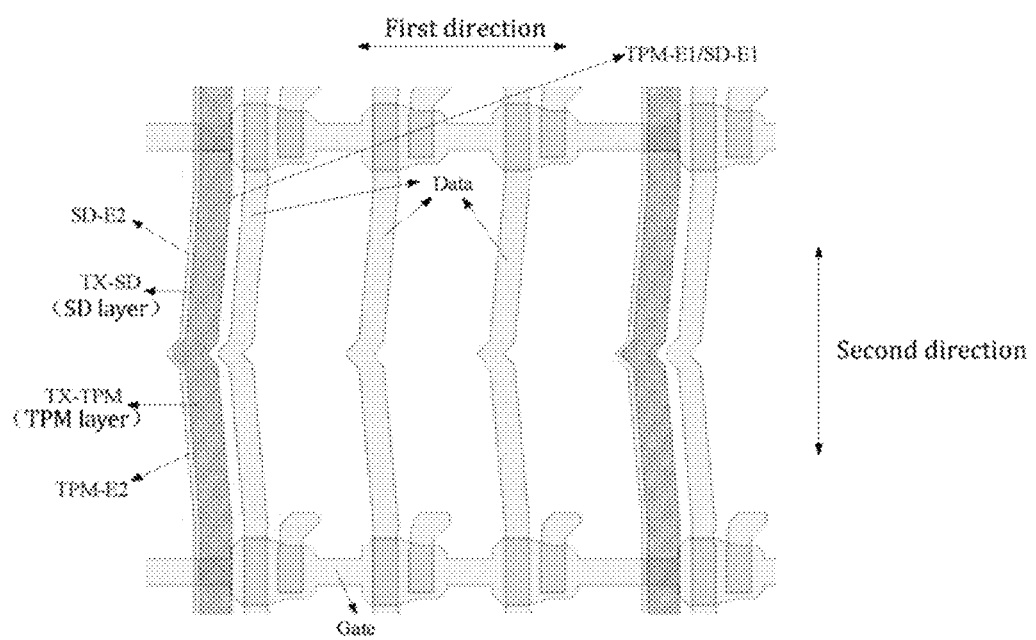
FIG. 4 is a schematic diagram of an array substrate according to an embodiment of this disclosure.

FIG. 3A shows a layout of touch signal lines arranged in layers according to an embodiment of this disclosure, FIG. 3B is a schematic diagram of improving abnormal liquid crystal orientation by touch signal lines arranged in layers according to an embodiment of this disclosure, and FIG. 4 is a schematic diagram of an array substrate according to an embodiment of this disclosure.

Referring to FIG. 3A, FIG. 3B and FIG. 4, the array substrate according to an embodiment of this disclosure comprises: a substrate; a plurality of gate lines Gate and a plurality of data lines Data located on the substrate; and a plurality of touch signal lines TX located on the substrate. The plurality of gate lines Gate extend along a first direction and are arranged in a second direction different from the first direction. The plurality of data lines Data extend in the second direction and are arranged in the first direction. The plurality of gate lines Gate intersect with the plurality of data lines Data to define a plurality of pixel areas. The plurality of touch signal lines TX extend in the second direction. Each of the plurality of touch signal lines TX comprises a lower touch signal line TX-SD and an upper touch signal line TX-TPM. The lower touch signal line TX-SD is located in a same layer as the plurality of data lines Data, and the upper touch signal line TX-TPM is located above the lower touch signal line TX-SD in a direction perpendicular to the array substrate. Each touch signal line TX is adjacent to one of the plurality of data lines Data (hereinafter referred to as the adjacent data line, i.e., the adjacent data line is a data line Data in the plurality of data lines Data that is closest to a touch signal line TX). The lower touch signal line TX-SD comprises a first lower edge SD-E1 and a second lower edge SD-E2 extending along the second direction. A distance from the first lower edge SD-E1 to the adjacent data line in the first direction is less than a distance from the second lower edge SD-E2 to the adjacent data line in the first direction, i.e., the first lower edge SD-E1 is closer to the adjacent data line in the first direction than the second lower edge SD-E2. The upper touch signal line comprises a first upper edge TPM-E1 and a second upper edge TPM-E2 extending in the second direction. A distance from the first upper edge TPM-E1 to the adjacent data line in the first direction is less than a distance from the second upper edge TPM-E2 to the adjacent data line in the first direction, i.e., the first upper edge TPM-E1 is closer to the adjacent data line in the first direction than the second upper edge TPM-E2. A distance from the second upper edge TPM-E2 of the upper touch signal line TX-TPM to the adjacent data line in the first direction is less than a distance from the second lower edge SD-E2 of the lower touch signal line TX-SD to the adjacent data line in the first direction, i.e., the second upper edge TPM-E2 of the upper touch signal line TX-TPM is closer to the adjacent data line in the first direction than the second lower edge SD-E2 of the lower touch signal line TX-SD.

As shown in FIG. 3A, the difference between the distance from the second upper edge TPM-E2 of the upper touch signal line TX-TPM to the adjacent data line and the distance from the second lower edge SD-E2 of the lower touch signal line TX-SD to the adjacent data line is d, that is to say, the second upper edge TPM-E2 of the upper touch signal line TX-TPM and the second lower edge SD-E2 of the lower touch signal line TX-SD are staggered in the first direction by a distance d.

As shown in FIG. 3B, the staggered arrangement of the upper touch signal line TX-TPM and the lower touch signal line TX-SD reduces the slope angle of the passivation layer PVX covering the touch signal line TX, thereby ensuring the normal orientation of the liquid crystal sandwiched between the array substrate and the opposite substrate after assembling, and avoiding poor light leakage at the pixel edges.

According to an embodiment of this disclosure, the distance from the first upper edge TPM-E1 of the upper touch signal line TX-TPM to the adjacent data line in the first direction is essentially the same as the distance from the first lower edge SD-E1 of the lower touch signal line TX-SD to the adjacent data line in the first direction.

Referring to FIG. 4, the first upper edge TPM-E1 of the upper touch signal line TX-TPM and the first lower edge SD-E1 of the lower touch signal line TX-SD can essentially overlap in the top view of the array substrate. For this design, at the overlapping edge, the slope angle of the PVX covering it will be larger, but since the edge is located in the middle of the non-transparent area, it will not affect the leakage of light. According to this design, the width of the upper touch signal line TX-TPM in the first direction (a2 shown in FIG. 3A) is smaller than the width of the lower touch signal line TX-SD in the first direction (a1 shown in FIG. 3A), that is, a2<a1.

According to other embodiments of this disclosure, the width of the upper touch signal line TX-TPM in the first direction (a2 shown in FIG. 3A) is essentially the same as the width of the lower touch signal line TX-SD in the first direction (a1 shown in FIG. 3A), that is, a2=a1. That is to say, based on the scheme shown in FIG. 2A, the upper touch signal line TX-TPM is moved to the right in the first direction to be staggered with the edge of the lower touch signal line TX-SD, which can also reduce the slope angle of the PVX covering it. Without reducing the width of the upper touch signal line TX-TPM in the first direction, the resistance of the touch signal line TX can be maintained to ensure the driving frequency of the touch signal.

According to other embodiments of this disclosure, the width of the upper touch signal line TX-TPM in the first direction can be greater than the width of the lower touch signal line TX-SD in the first direction (as shown in FIG. 3B), that is, a2>a1. Increasing the width of the upper touch signal line TX-TPM in the first direction helps to further reduce the resistance of the touch signal line TX.

According to this design, after the upper touch signal line TX-TPM and the lower touch signal line TX-SD are staggered in the first direction, the distance between the upper touch signal line TX-TPM and the upper ITO (i.e. the $2^{nd}$ ITO shown in FIG. 2A) decreases, that is, the distance b shown in FIG. 3A decreases to distance e. If the design distance between the upper touch signal line TX-TPM and the upper ITO is insufficient, after actual fabrication, the upper ITO and the upper touch signal line TX-TPM may overlap, generating overlapping capacitance.

In order to avoid the generation of overlapping capacitance, according to other embodiments of this disclosure, the data line Data next to the touch signal line TX and the upper ITO can also be moved to the right on the basis of the scheme shown in FIG. 2A, so as to increase the distance between the upper ITO and the upper touch signal line TX-TPM layer. However, this design will affect the opening rate.

Figure 5:
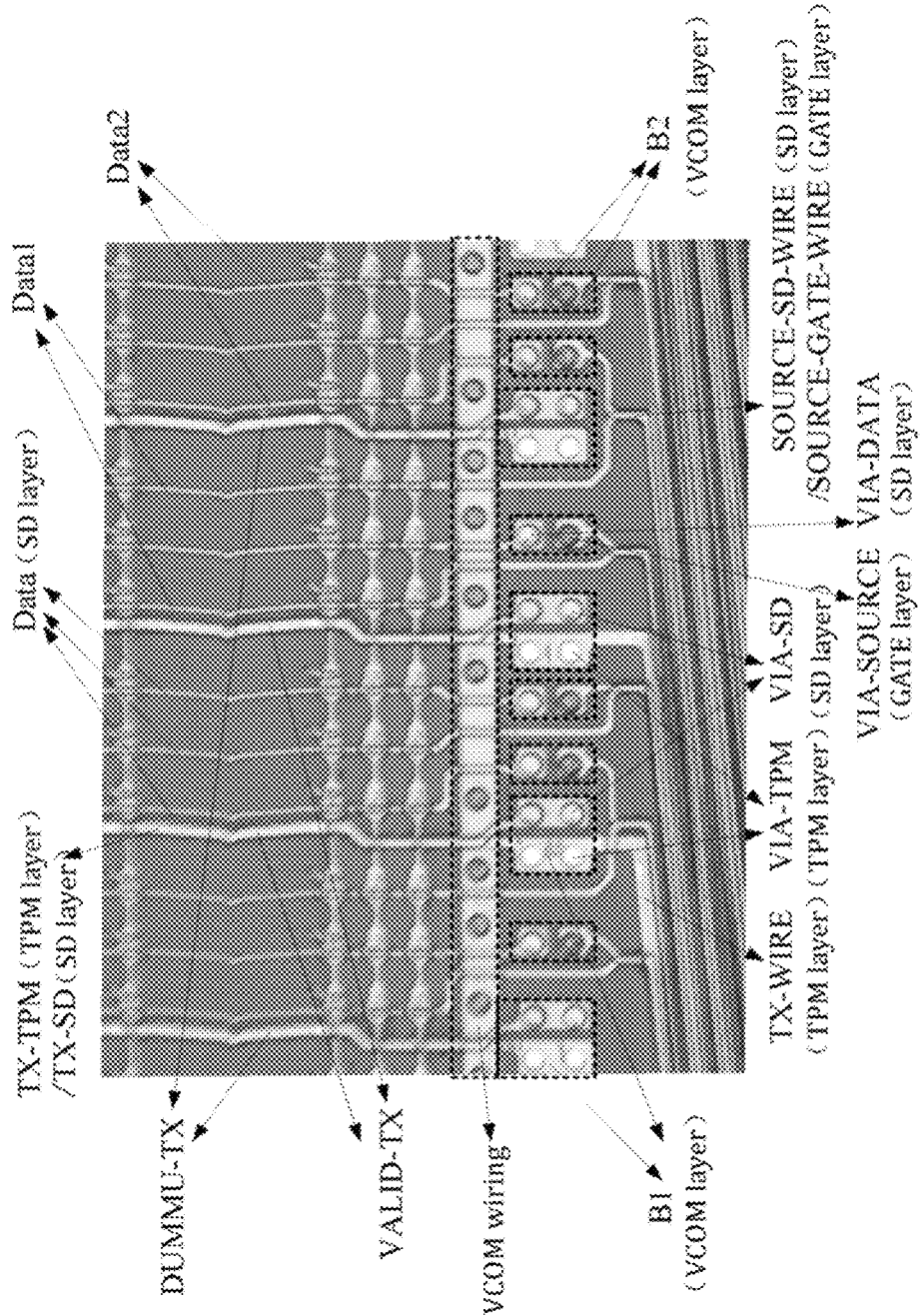
FIG. 5 shows the wiring of the array substrate in the display area and non-display area according to an embodiment of this disclosure.

The array substrate according to an embodiment of this disclosure may comprise a display area and a non-display area adjacent to each other. FIG. 5 shows the wiring of the array substrate in the display area and non-display area according to an embodiment of this disclosure.

As shown in FIG. 5, the array substrate according to an embodiment of this disclosure may comprise a first overlapping electrode B1. The upper touch signal line TX-TPM and the lower touch signal line TX-SD of each touch signal line TX are electrically connected to each other via the first overlapping electrode B1.

According to an embodiment of this disclosure, an upper via hole VIA-TPM connected to the upper touch signal line TX-TPM and a lower via hole VIA-SD connected to the lower touch signal line TX-SD are formed at positions of the non-display area close to the display area. The first overlapping electrode B1 is electrically connected to the upper touch signal line TX-TPM and the lower touch signal line TX-SD via the upper via hole VIA-TPM and the lower via hole VIA-SD, so that the upper touch signal line TX-TPM and the lower touch signal line TX-SD are electrically connected to each other.

Referring to FIG. 5, according to an embodiment of this disclosure, the upper via hole VIA-TPM and lower via hole VIA-SD are aligned in the first direction. According to this design, it is beneficial for the design of narrow borders.

According to an embodiment of this disclosure, the plurality of touch signal lines TX comprise valid touch signal lines VALID-TX and dummy touch signal lines DUMMY-TX, and the dummy touch signal lines DUMMY-TX are electrically connected to a common signal line (VCOM wiring) via the first overlapping electrode B1, while the first overlapping electrode B1 electrically connected to the valid touch signal lines VALID-TX is not connected to the common signal line (VCOM wiring).

According to the IC specifications (i.e. IC driving capability, number of supported touch signal channels, etc.) and the product specifications (i.e. pixel size, resolution, opening rate, etc.), the number of touch signal channels that the IC can support may be less than the number of touch signal lines that can be arranged in the array substrate. Therefore, it is possible to arrange valid touch signal lines VALID-TX with the same number as that of the touch signal channels that the IC can support, while the other touch signal lines TX are set as dummy touch signal lines DUMMY-TX. The dummy touch signal line DUMMY-TX is connected to the surrounding common signal line (VCOM wiring) through via holes (including the upper via hole VIA-TPM and the lower via hole VIA-SD) via the first overlapping electrode B1, which can avoid signal floating in pixels.

The array substrate according to an embodiment of this disclosure may further comprise a plurality of touch electrodes (TX electrodes). The first overlapping electrode B1, the plurality of touch electrodes (TX electrodes) and the common signal line (VCOM wiring) are arranged in a same layer (VCOM layer), and each valid touch signal line VALID-TX is electrically connected to a touch electrode (TX electrode) in the display area respectively.

By dividing the common electrode (Vcom electrode) into a plurality of touch sensing units, each touch electrode (TX electrode) can be obtained. Therefore, the touch electrode (TX electrode) can be arranged in the same layer (VCOM layer) as the common signal line (VCOM wiring). In addition, the first overlapping electrode B1 used for electrically connecting the upper touch signal line TX-TPM and the lower touch signal line TX-SD can also be arranged in the same layer (VCOM layer) as the touch electrode (TX electrode) and the common signal line (VCOM wiring). The first overlapping electrode B1 electrically connected to the dummy touch signal line DUMMY-TX can be formed to be connected to a common signal line (VCOM wiring) arranged in the same layer, while the first overlapping electrode B1 electrically connected to the valid touch signal line VALID-TX is not connected to the common signal line (VCOM wiring).

Referring to FIG. 5, according to an embodiment of this disclosure, the non-display area comprises a plurality of touch signal leads TX-WIRE, a plurality of upper source signal leads SOURCE-SD-WIRE, and a plurality of lower source signal leads SOURCE-GATE-WIRE, and the plurality of data lines Data comprise a plurality of first data lines Data1 and a plurality of second data lines Data2. The plurality of touch signal leads TX-WIRE are arranged in the same layer as the upper touch signal line TX-TPM of the plurality of touch signal lines TX, and are respectively connected and extended with the upper touch signal line TX-TPM of the plurality of touch signal lines TX. The plurality of upper source signal leads SOURCE-SD-WIRE are arranged in the same layer as the plurality of data lines Data and the lower touch signal line TX-SD of the plurality of touch signal lines TX, and are respectively connected and extended with the plurality of first data lines Data1. The plurality of lower source signal leads SOURCE-GATE-WIRE are located below the plurality of upper source signal leads SOURCE-SD-WIRE in a direction perpendicular to the array substrate, and each lower source signal lead SOURCE-GATE-WIRE is electrically connected to a second data line Data2.

A plurality of fan out lines are led out from the IC, including touch signal fan out lines (i.e., touch signal leads TX-WIRE) and source signal fan out lines (i.e., source signal leads). The touch signal leads TX-WIRE can be wired on the TPM metal layer, that is, arranged in the same layer as the upper touch signal line TX-TPM of the touch signal line TX. The source signal leads can include the upper source signal lead SOURCE-SD-WIRE and the lower source signal lead SOURCE-GATE-WIRE wired in different metal layers. The upper source signal lead SOURCE-SD-WIRE can be wired in the SD metal layer, i.e., being arranged in the same layer as the data line Data and the lower touch signal line TX-SD of touch signal line TX, thus can be directly connected to the data line Data (i.e., the first data line Data1). The lower source signal lead SOURCE-GATE-WIRE can be wired in the lower metal layer of the SD metal layer, such as the gate metal layer (i.e., the metal layer used for arranging the gate line). Therefore, the lower source signal lead SOURCE-GATE-WIRE wired in the gate metal layer needs to be electrically connected to the data line Data (i.e., the second data line Data2) wired in the SD metal layer through the overlapping electrode.

According to an embodiment of this disclosure, a data line via hole VIA-DATA connected to the second data line Data2 and a source line via hole VIA-SOURCE connected to the lower source signal lead SOURCE-GATE-WIRE are formed at positions of the non-display area close to the display area. Each lower source signal lead SOURCE-GATE-WIRE is electrically connected to a second data line Data2 in the plurality of second data lines Data via the source line via hole VIA-SOURCE, the second overlapping electrode B2, and the data line via hole VIA-DATA. The first overlapping electrode B1 and the second overlapping electrode B2 are arranged in the same layer.

The description of the second overlapping electrode B2 can refer to the relevant description of the first overlapping electrode B1, and will not be repeated here. In addition, the data line via hole VIA-DATA and source line via hole VIA-SOURCE can be aligned in the first direction with the upper via hole VIA-TPM of the upper touch signal line TX-TPM and the lower via hole VIA-SD of the lower touch signal line TX-SD, respectively, to facilitate the design of narrow borders.

Figure 6A:
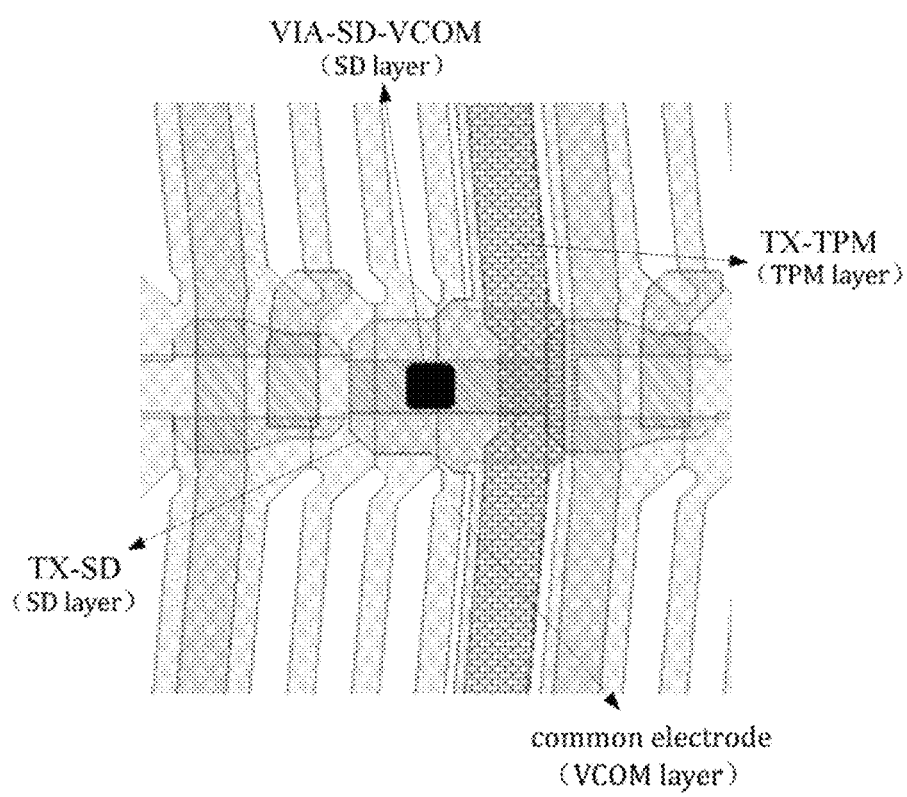
FIG. 6A is a schematic diagram of the connection between the common electrode and the lower touch signal line in the array substrate according to an embodiment of this disclosure.
Figure 6B:
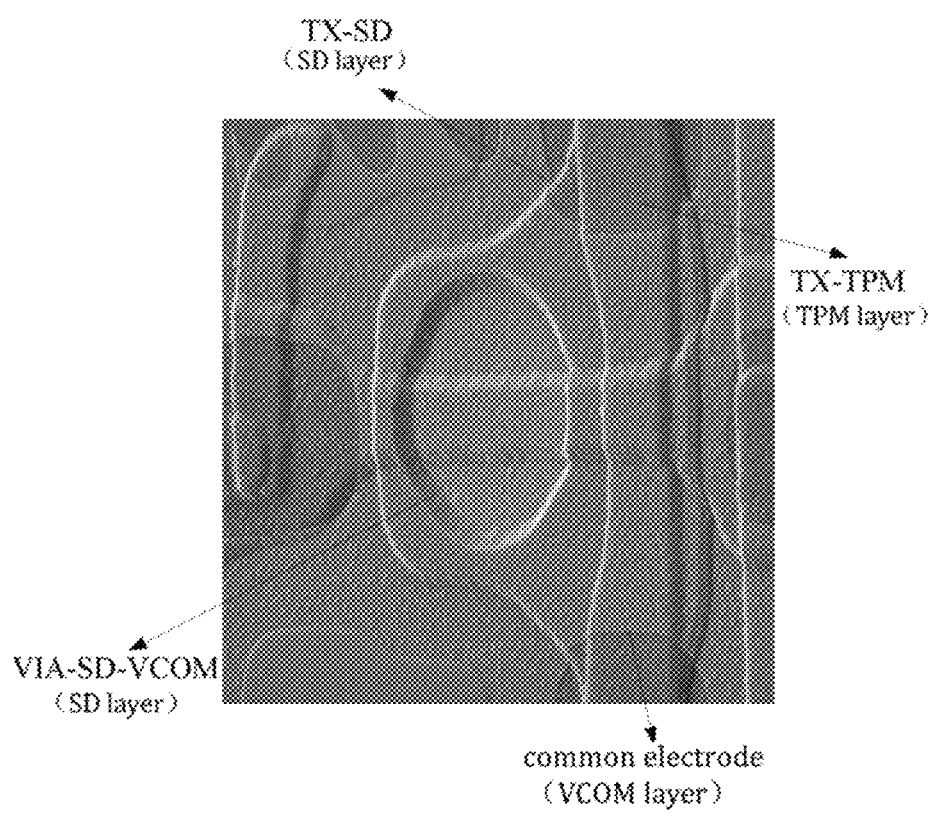
FIG. 6B is an electron microscope scanning image based on the connection shown in FIG. 6A.
Figure 7A:
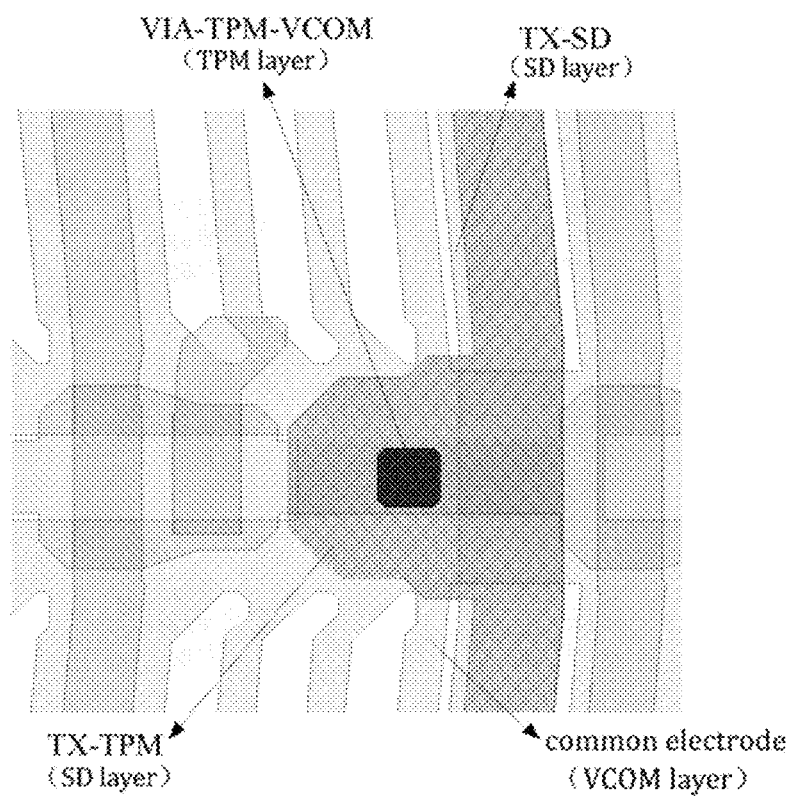
FIG. 7A is a schematic diagram of the connection between the common electrode and the upper touch signal line in the array substrate according to an embodiment of this disclosure.
Figure 7B:
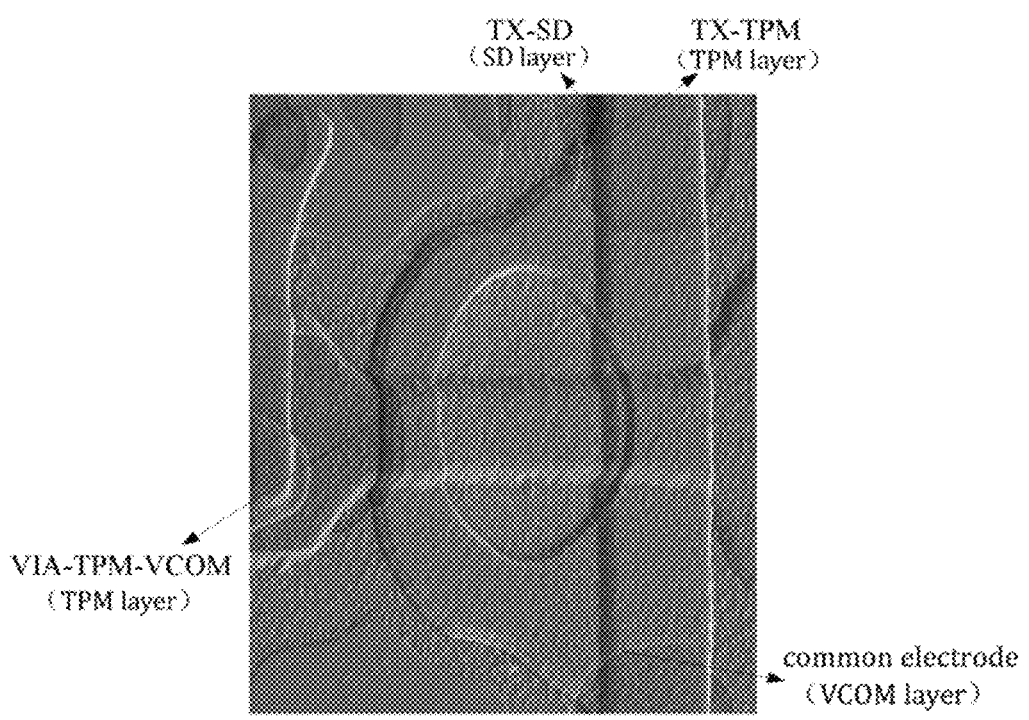
FIG. 7B is an electron microscope scanning image based on the connection shown in FIG. 7A.

FIG. 6A shows the connection between the common electrode (Vcom electrode) and the lower touch signal line TX-SD. FIG. 6B is an electron microscope scanning image based on the connection shown in FIG. 6A. FIG. 7A shows the connection between the common electrode (Vcom electrode) and the upper touch signal line TX-TPM. FIG. 7B is an electron microscope scanning image based on the connection shown in FIG. 7A.

Referring to FIG. 6A and FIG. 6B, the lower touch signal line TX-SD located in the SD metal layer is extended to form a SD layer metal platform. The SD layer via hole VIA-SD-VCOM can be formed to connect to the SD layer metal platform. The SD layer via hole VIA-SD-VCOM is covered by the common electrode (Vcom electrode) to achieve conduction between the SD metal layer and the common electrode.

Referring to FIG. 7A and FIG. 7B, the upper touch signal line TX-TPM located in the TPM metal layer is extended to form a TPM layer metal platform. The TPM layer via hole VIA-TPM-VCOM can be formed to connect to the TPM layer metal platform. The TPM layer via hole VIA-TPM-VCOM is covered by the common electrode (Vcom electrode) to achieve conduction between the TPM metal layer and the common electrode.

The touch signal provided by the IC is transmitted to the upper touch signal line TX-TPM of the display area through the touch signal fan out line (i.e., the touch signal lead TX-WIRE) of the non-display area, and transmitted to the lower touch signal line TX-SD of the display area through the upper via hole VIA-TPM, the first overlapping electrode B1, and the lower via hole VIA-SD, and then transmitted to the common electrode (Vcom electrode) serving as the touch electrode (TX electrode) through the SD layer via hole VIA-SD-VCOM connected to the lower touch signal line TX-SD and the TPM layer via hole VIA-TPM-VCOM connected to the upper touch signal line TX-TPM.

Figure 8A:
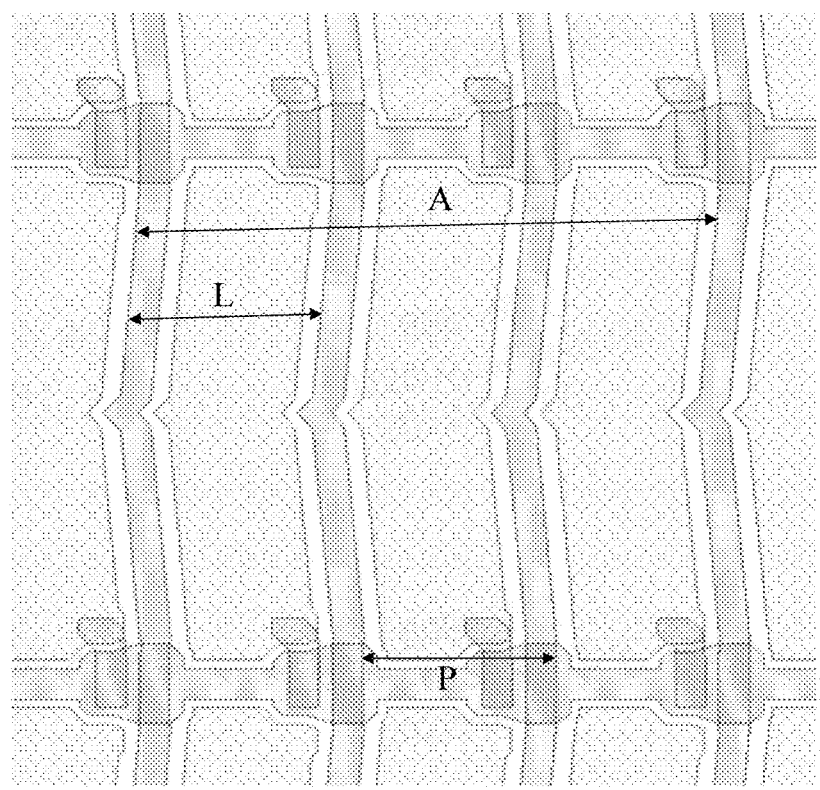
FIG. 8A is a schematic diagram of an array substrate with equidistant design for non TDDI products.
Figure 8B:
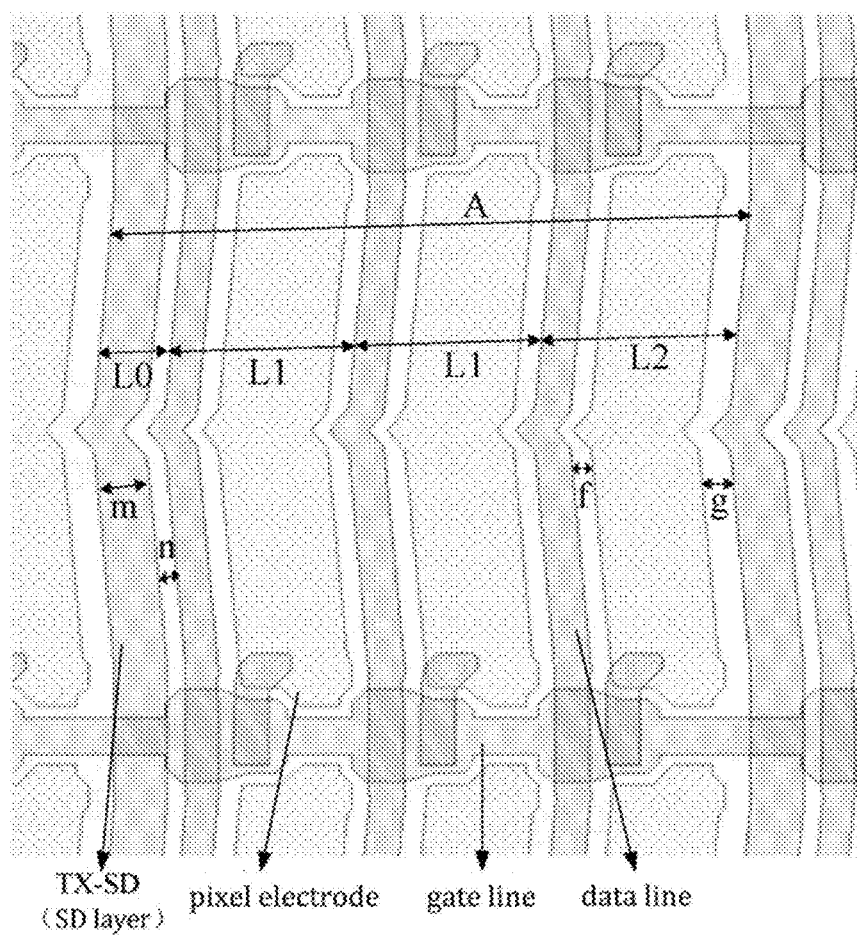
FIG. 8B is a schematic diagram of an array substrate with non-equidistant design for TDDI products.

FIG. 8A is a schematic diagram of an array substrate with equidistant design for non TDDI products. FIG. 8B is a schematic diagram of an array substrate with non-equidistant design for TDDI products.

When the array substrate is applied to non TDDI products, the data lines can be arranged with equal pitch. When the array substrate is applied to TDDI products, as shown in FIG. 8B, the data lines are arranged with unequal pitch, and various distances (L0 to L2, as well as the distances f, g, m, n as shown) need to be determined in order to determine the pixel design. The array substrate provided in this disclosure is applied to TDDI products.

According to an embodiment of this disclosure, the distance between at least two adjacent data lines in the plurality of data lines is different from the distance between other adjacent data lines.

For example, as shown in FIG. 8B, three data lines Data corresponding to the three pixel electrodes are arranged between two touch signal lines TX. Due to the introduction of the touch signal lines TX, the data lines Data are not arranged with equal pitch. For example, a touch signal line TX is arranged between the two data lines Data on the far right, so the distance between them (L2+L0) is significantly greater than the distance L1 between other adjacent data lines.

Returning to FIG. 3A, according to an embodiment of this disclosure, the substrate can comprise a first substrate, on which a gate insulating layer GI is provided, a plurality of data lines Data and a lower touch signal line TX-SD of a plurality of touch signal lines TX are arranged on the gate insulating layer GI, and the array substrate further comprises a passivation layer PVX formed on the gate insulating layer GI. The passivation layer PVX covers the plurality of data lines DATA and the plurality of touch signal lines TX.

The array substrate according to an embodiment of this disclosure further comprises a plurality of pixel electrodes (i.e., 1$^{st}$ ITO shown in FIG. 3A) arranged in a plurality of pixel areas respectively, and the plurality of pixel electrodes are arranged in a same layer as the plurality of data lines Data and the lower touch signal line TX-SD of the plurality of touch signal lines TX. The passivation layer PVX covers the plurality of pixel electrodes.

The array substrate according to an embodiment of this disclosure, for the touch signal lines arranged in layers, as the edge of the upper touch signal line is staggered from the edge of the lower touch signal line, for example, the edge of the upper touch signal line near the opening area is further away from the opening area than the edge of the lower touch signal line near the opening area, can reduce the slope angle of the passivation layer covering it, ensure the normal orientation of the liquid crystal sandwiched between the array substrate and the opposite substrate after assembling, and avoid the occurrence of poor light leakage at the pixel edges.

This disclosure further provides a touch display device comprising an array substrate according to embodiments of this disclosure and an opposite substrate opposite to the array substrate.

Figure 9:
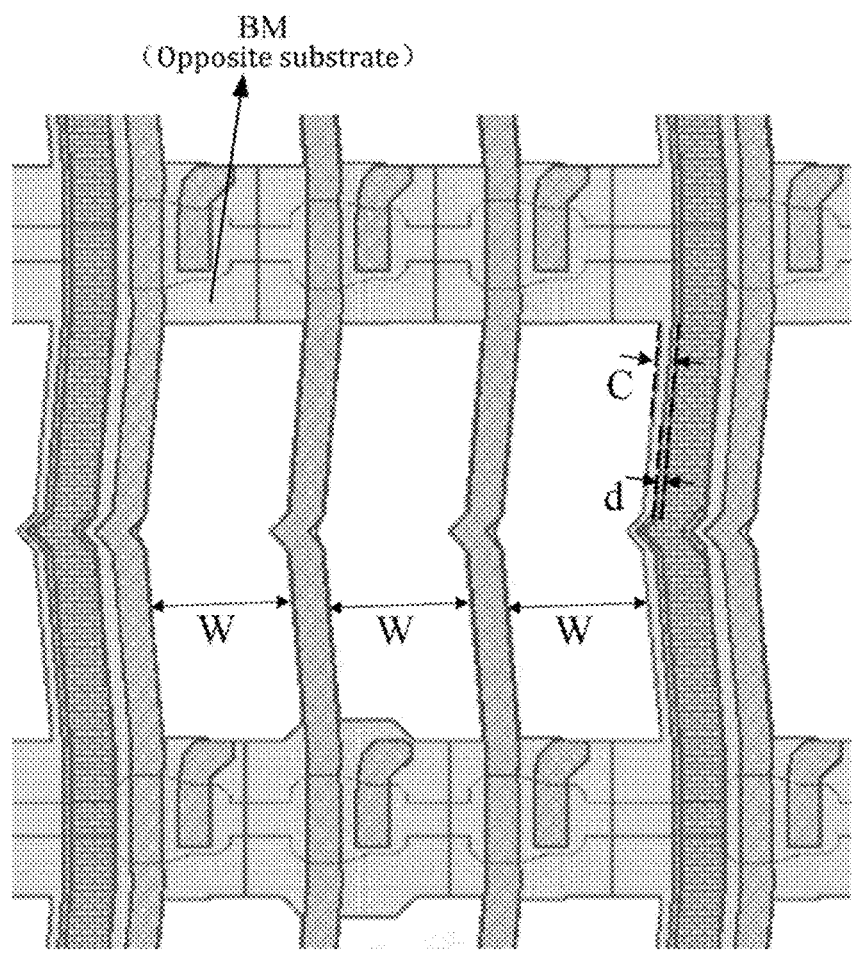
FIG. 9 is a schematic diagram of an opposite substrate according to an embodiment of this disclosure.

FIG. 9 is a schematic diagram of the opposite substrate according to an embodiment of this disclosure.

Referring to FIG. 3A, FIG. 4 and FIG. 9, according to an embodiment of this disclosure, the opposite substrate comprises a black matrix layer BM. A portion of the pixel area exposed by the black matrix layer BM is an opening area. The distance from the second upper edge TPM-E2 of the upper touch signal line TX-TPM to the edge of the opening area in the first direction is greater than the distance from the second lower edge SD-E2 of the lower touch signal line TX-SD to the edge of the opening area in the first direction.

As shown in FIG. 9, according to an embodiment of this disclosure, the distance (i.e., the distance C shown in FIG. 9) from the edge of the opening area to the second upper edge TPM-E2 of the upper touch signal line TX-TPM in the first direction is greater than or equal to 3 µm.

Figure 10:
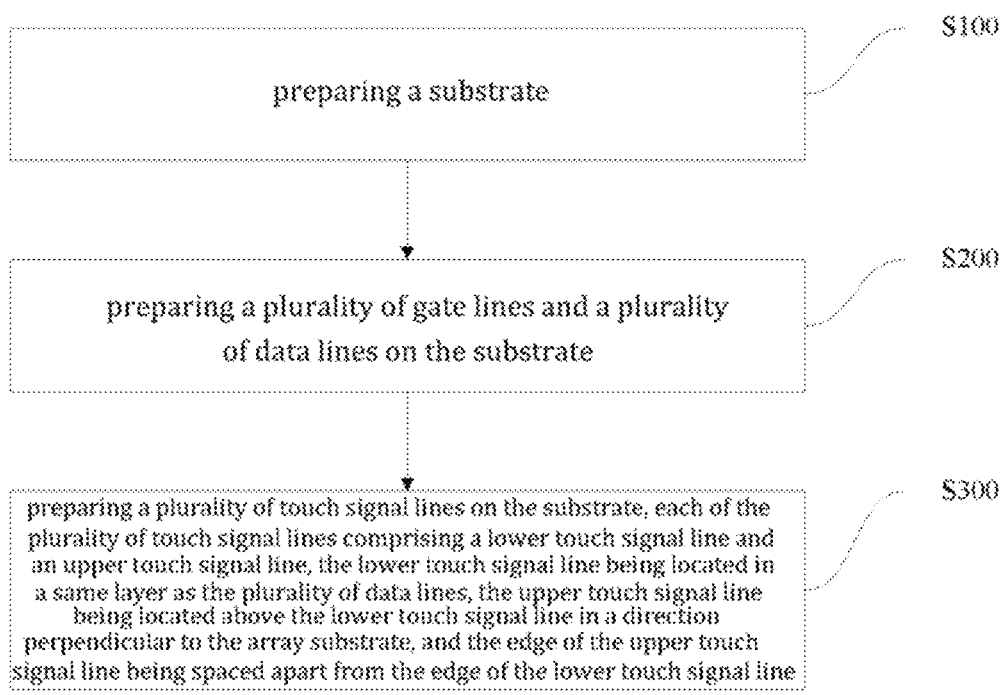
FIG. 10 is a flow chart of a preparation method of an array substrate according to an embodiment of this disclosure.

This disclosure further provides a preparation method of an array substrate. FIG. 10 is a flow chart of the preparation method of an array substrate according to an embodiment of this disclosure.

Referring to FIG. 10, the preparation method of an array substrate according to an embodiment of this disclosure comprises the following steps S100 to S300.

At step S100, a substrate is prepared.

At step S200, a plurality of gate lines and a plurality of data lines are prepared on the substrate. The plurality of gate lines extend along a first direction and are arranged in a second direction different from the first direction. The plurality of data lines extend in the second direction and are arranged in the first direction. The plurality of gate lines intersect with the plurality of data lines to define a plurality of pixel areas.

At step S300, a plurality of touch signal lines are prepared on the substrate. The plurality of touch signal lines extend in the second direction. Each of the plurality of touch signal lines comprises a lower touch signal line and an upper touch signal line. The lower touch signal line is located in a same layer as the plurality of data lines. The upper touch signal line is located above the lower touch signal line in a direction perpendicular to the array substrate. Each touch signal line is adjacent to one of the plurality of data lines (i.e., the adjacent data line). The lower touch signal line comprises a first lower edge and a second lower edge extending along the second direction. A distance from the first lower edge to the adjacent data line in the first direction is less than a distance from the second lower edge to the adjacent data line in the first direction. The upper touch signal line comprises a first upper edge and a second upper edge extending along the second direction. A distance from the first upper edge to the adjacent data line in the first direction is less than a distance from the second upper edge to the adjacent data line in the first direction. A distance from the second upper edge of the upper touch signal line to the adjacent data line in the first direction is less than a distance from the second lower edge of the lower touch signal line to the adjacent data line in the first direction.

According to an embodiment of this disclosure, preparing a plurality of touch signal lines on the substrate (i.e., the step S300) may comprise: forming the plurality of touch signal lines so that a distance from the first upper edge of the upper touch signal line to the adjacent data line in the first direction is essentially the same as a distance from the first lower edge of the lower touch signal line to the adjacent data line in the first direction.

According to other embodiments of this disclosure, preparing a plurality of touch signal lines on the substrate (i.e., the step S300) may comprise: forming the plurality of touch signal lines so that a width of the upper touch signal line in the first direction is greater than a width of the lower touch signal line in the first direction.

According to other embodiments of this disclosure, preparing a plurality of touch signal lines on the substrate (i.e., the step S300) may comprise: forming the plurality of touch signal lines so that a width of the upper touch signal line in the first direction is essentially the same as a width of the lower touch signal line in the first direction.

The array substrate according to an embodiment of this disclosure may comprise a display area and a non-display area adjacent to each other.

The preparation method of an array substrate according to an embodiment of this disclosure may further comprise: preparing a first overlapping electrode. The upper touch signal line and the lower touch signal line of each touch signal line are electrically connected to each other via the first overlapping electrode.

The preparation method of an array substrate according to an embodiment of this disclosure may further comprise: forming, at positions of the non-display area close to the display area, an upper via hole connected to the upper touch signal line and a lower via hole connected to the lower touch signal line, and forming the first overlapping electrode to be electrically connected to the upper touch signal line and the lower touch signal line via the upper via hole and the lower via hole, so that the upper touch signal line and the lower touch signal line are electrically connected to each other.

According to an embodiment of this disclosure, the upper via hole and the lower via hole can be formed to be aligned in the first direction to facilitate the design of narrow borders.

According to an embodiment of this disclosure, the plurality of touch signal lines comprise valid touch signal lines and dummy touch signal lines, and preparing the first overlapping electrode comprises: forming the first overlapping electrode so that the dummy touch signal lines are electrically connected to a common signal line via the first overlapping electrode, while the first overlapping electrode electrically connected to the valid touch signal lines is not connected to the common signal line.

The preparation method of an array substrate according to an embodiment of this disclosure further comprises: preparing a plurality of touch electrodes. The first overlapping electrode, the plurality of touch electrodes and the common signal line can be prepared in the same layer, and each valid touch signal line is electrically connected to a touch electrode in the display area respectively.

By dividing the common electrode into a plurality of touch sensing units, each touch electrode is obtained, so the touch electrode can be arranged in the same layer as the common signal line. In addition, the first overlapping electrode used for electrically connecting the upper touch signal line and the lower touch signal line can also be prepared in the same layer as the touch electrode and the common signal line. Preparing the first overlapping electrode may comprise: forming the first overlapping electrode electrically connected to the dummy touch signal line to be connected to the common signal line arranged in the same layer, while forming the first overlapping electrode electrically connected to the valid touch signal line to be not connected to the common signal line.

The preparation method of an array substrate according to an embodiment of this disclosure further comprises: preparing a plurality of touch signal leads, a plurality of upper source signal leads and a plurality of lower source signal leads in the non-display area, and the plurality of data lines comprise a plurality of first data lines and a plurality of second data lines. The plurality of touch signal leads are formed in the same layer as the upper touch signal line of the plurality of touch signal lines and are respectively connected and extended with the upper touch signal line of the plurality of touch signal lines. The plurality of upper source signal leads are formed in the same layer as the plurality of data lines and the lower touch signal line of the plurality of touch signal lines and are respectively connected and extended with the plurality of first data lines. The plurality of lower source signal leads are formed to be located below the plurality of upper source signal leads in a direction perpendicular to the array substrate, and each lower source signal lead is electrically connected to a second data line.

A plurality of fan out lines are led out from the IC, including touch signal fan out lines (i.e. touch signal leads) and source signal fan out lines (i.e. source signal leads). The touch signal lead can be wired on the TPM metal layer, that is, the touch signal lead can be formed in the same layer as the upper touch signal line of the touch signal line. The source signal lead can include an upper source signal lead and a lower source signal lead wired in different metal layers. The upper source signal lead can be wired on the SD metal layer, that is, the upper source signal lead can be formed in the same layer as the data line and the lower touch signal line of the touch signal line, and can be directly connected to the data line (i.e., the first data line). The lower source signal lead can be wired in the lower metal layer of the SD metal layer, for example, the GATE metal layer (i.e., the metal layer for arranging gate lines). Therefore, the lower source signal lead wired in the GATE metal layer needs to be electrically connected to the data line (i.e., the second data line) wired in the SD metal layer through the overlapping electrode.

The preparation method of an array substrate according to an embodiment of this disclosure further comprises: forming, at positions of the non-display area close to the display area, a data line via hole connected to the second data line and a source line via hole connected to the lower source signal lead; and preparing a second overlapping electrode. Each lower source signal lead is electrically connected to one of the plurality of second data lines via the source line via hole, the second overlapping electrode and the data line via hole. The second overlapping electrode can be formed in the same layer as the first overlapping electrode.

The description of the preparation of the second overlapping electrode can refer to the relevant description of the preparation of the first overlapping electrode, and will not be repeated here. In addition, the data line via hole and the source line via hole can be formed to be aligned with the upper via hole of the upper touch signal line and the lower via hole of the lower touch signal line in the first direction, respectively, to facilitate the design of narrow borders.

According to an embodiment of this disclosure, preparing a plurality of data lines (i.e., the step S200) may comprise: forming the distance between at least two adjacent data lines in the plurality of data lines to be different from the distance between other adjacent data lines.

According to an embodiment of this disclosure, preparing a substrate (i.e., the step S100) may comprise: preparing a first substrate, and forming a gate insulating layer on the first substrate. The plurality of data lines and the lower touch signal line of the plurality of touch signal lines can be formed on the gate insulating layer, and the preparation method of an array substrate further comprises: forming a passivation layer on the gate insulating layer to cover the plurality of data lines and the plurality of touch signal lines.

The preparation method of an array substrate according to an embodiment of this disclosure further comprises: forming a plurality of pixel electrodes in a plurality of pixel areas, and the plurality of pixel electrodes are formed in the same layer as the plurality of data lines and the lower touch signal line of the plurality of touch signal lines. The passivation layer covers the plurality of pixel electrodes.

The description of the embodiment of the preparation method of an array substrate may refer to the relevant description of the embodiment of the array substrate, which will be not repeated here.

The preparation method of an array substrate according to this disclosure, for the touch signal lines arranged in layers, as the edge of the upper touch signal line is staggered from the edge of the lower touch signal line, i.e., the edge of the upper touch signal line near the opening area is further away from the opening area than the edge of the lower touch signal line near the opening area, can reduce the slope angle of the passivation layer covering it, ensure the normal orientation of the liquid crystal sandwiched between the array substrate and the opposite substrate after assembling, and avoid the occurrence of poor light leakage at the pixel edges.

The following provides a detailed explanation of the technical solution of this disclosure based on specific examples. It should be recognized that the various parameters and data listed in the following examples are only used to illustrate the technical solution of this disclosure, and not to limit the scope of this disclosure.

Figure 1A:
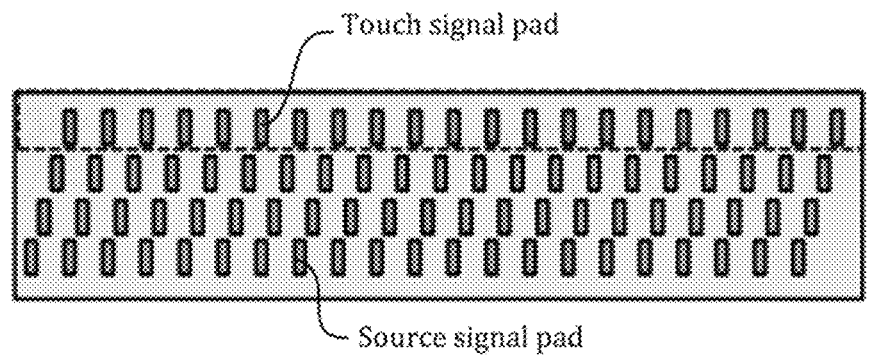
FIG. 1A shows a design for the layout of source signal pads and touch signal pads.
Figure 1B:
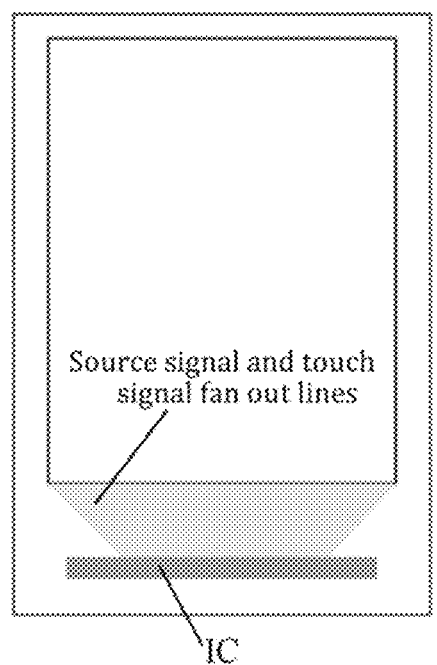
FIG. 1B is a schematic diagram of the fan out line wiring based on the layout shown in FIG. 1A.
Figure 1C:
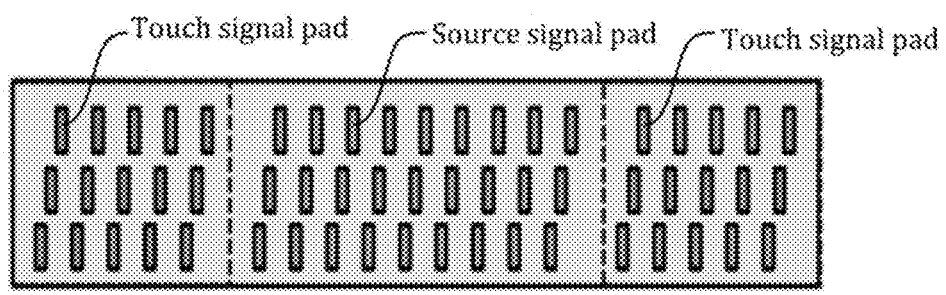
FIG. 1C shows another design for the layout of source signal pads and touch signal pads.
Figure 1D:
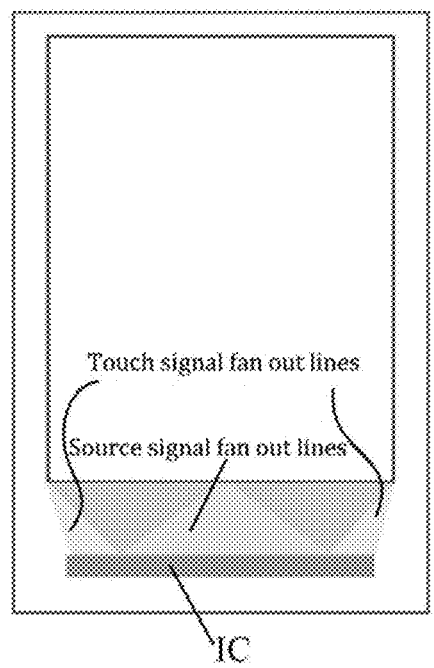
FIG. 1D is a schematic diagram of the fan out line wiring based on the layout shown in FIG. 1C.
Figure 1E:
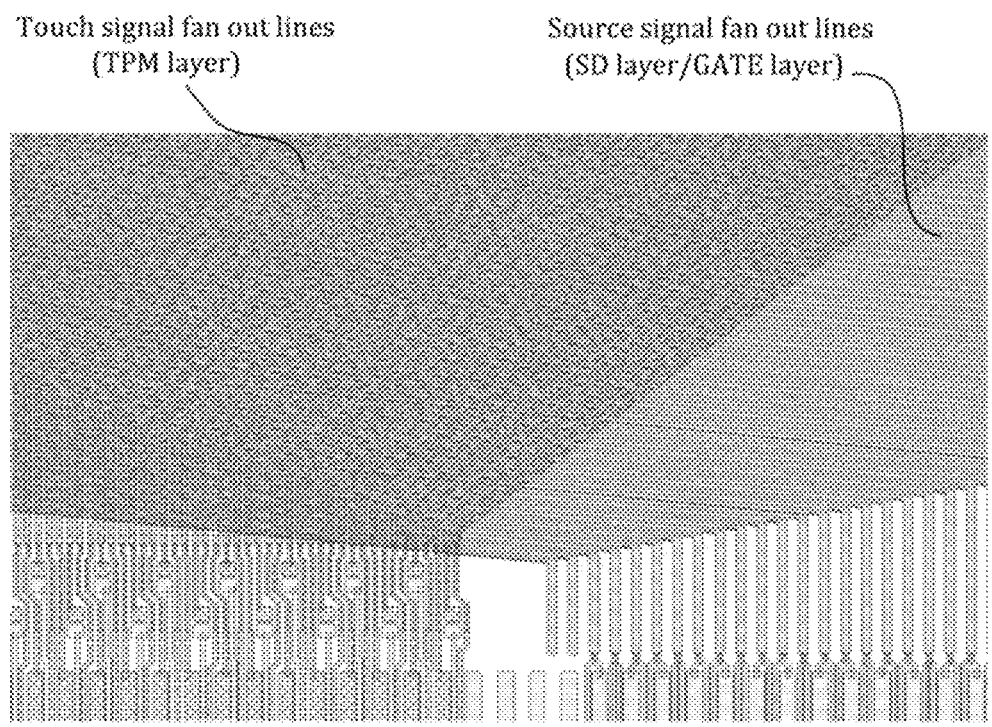
FIG. 1E shows an example of fan out line wiring based on the layout shown in FIG. 1C.

In the example, the IC signal channels are arranged as shown in FIG. 1C, i.e., the source signal channel is in the middle and the touch signal channels are on both sides of the source signal channel. Therefore, it is necessary to design a separate metal layer for the touch signal lead, namely the TPM metal layer. The resolution of the array substrate is 720×1440 (i.e. 720 pixels per row and 1440 pixels per column), and the maximum number of touch signal channels supported by the IC is 448, resulting in a total of 720× 3=2160 source signal leads (each pixel includes three sub-pixels, providing separate source signals for each sub-pixel, i.e. data signals), while there are a total of 448 touch signal leads. Refer to FIG. 1E, the touch signal leads are arranged on both sides, with 224 leads on each side, and are wired equidistantly on the TPM metal layer. The source signal leads are arranged in the middle, overlapped and wired equidistantly in the GATE metal layer and the SD metal layer, with 1080 leads per layer.

The touch signal lead located in the display area are wired between the SD metal layer and the TPM metal layer, while the touch signal leads located in the non-display area (such as the touch signal fan out lines) are all wired in the TPM metal layer. Therefore, it is necessary to add a connection unit (i.e., the first overlapping electrode) to connect the touch signal line (i.e., the lower touch signal line) of the SD metal layer with the touch signal line (i.e., the upper touch signal line) of the TPM metal layer.

The data lines located in the display area are all wired in the SD metal layer, while the source signal leads (such as source signal fan out lines) located in the non-display area are wired in the GATE metal layer and the SD metal layer. Therefore, it is necessary to add a connection unit (i.e., a second overlapping electrode) to connect the source signal leads of the GATE metal layer with the data lines of the SD metal layer.

One touch signal channel can control one touch block (i.e. touch electrode), and the IC provides 448 touch signal channels, so the entire display area needs to be divided into 448 blocks. The blocking scheme can be, for example, 16×28=448, i.e. 16 blocks per row and 28 blocks per column. Each block contains 720÷16=45 columns of pixels horizontally (i.e., in the first direction shown in FIG. 4), and 51 or 52 rows of pixels vertically (i.e., in the second direction shown in FIG. 4) (as 1440 cannot be evenly divided by 28, lines 1 to 16 contain 51 rows of pixels, and lines 17 to 28 contain 52 rows of pixels). Based on the above blocking scheme, the display area includes valid touch signal lines and dummy touch signal lines. The valid touch signal lines are connected to the touch signal leads through a connecting via hole (such as a lower via hole connected to the lower touch signal line), achieving transmission of touch signals. The dummy touch signal lines are connected to surrounding common signal lines through via holes (such as the upper via hole connected to the upper touch signal line and the lower via hole connected to the lower touch signal line) to avoid signal floating in pixels. Based on the above example, there are 448 valid touch signal lines and 720-448=272 dummy touch signal lines, with an approximate ratio of 2:1.

As shown in FIG. 5, the valid touch signal line and the dummy touch signal line are approximately distributed in a 2:1 ratio. The source signal lead of the SD metal layer located in the non-display area is directly connected to the data line located in the display area. The source signal lead of the GATE metal layer located in the non-display area is connected to the data line located in the display area through via holes (i.e. data line via hole and source line via hole).

Once again, the blocking scheme for the touch electrode mentioned above (16×28) and the design scheme of the valid touch signal line and the dummy touch signal line is only one embodiment of this disclosure, and there can be different designs in practical applications.

In the example, the size of the display area is 66.744 mm×136.08 mm with a resolution of 720×1440, calculated pixel spacing of 92.7 μm×94.5 μm. Each sub-pixel has a width of 92.7÷3=30.9 μm (each pixel includes three sub-pixels). For non TDDI products, data lines can be designed with equal pitch, i.e. pixel spacing of 30.9 μm. Referring to FIG. 8A, P=30.9 μm, A=3L=3×30.9×cos5; For the TDDI product applied in this disclosure, as shown in FIG. 8B, various distances (L0 to L2, as well as distances f, g, m, n) need to be determined in order to determine the pixel design.

As shown in FIG. 8B, A=92.7×cos5=L0+2×L1+L2, according to the width of the pixel electrode, L2-f-g=L1-f-f, it can be inferred that L2=L1+g-f (Formula 1), that is, A=L0+3×L1+(g−f) (Formula 2). F is the distance between the pixel electrode and the data line, and g is the distance between the pixel electrode and the touch signal line, mainly related to the anti-crosstalk level of the product (when the signal line voltage changes, the pixel voltage will be disturbed by the coupling capacitance, and the smaller the pitch is, the more severe the crosstalk will be). Generally, f is designed to be 4.35 to 5.5 μm. In this example, it is 4.35 μm. Generally g is designed from 5.5 to 6.4 μm. In this example, it is 5.8 μm. In addition, L0=m+n (Formula 3), where m is the width of the touch signal line (see a1 in FIG. 3A), and the required value can be comprehensively evaluated by the driving simulation results and opening rate results, in this example it is 6.0 μm; n is the distance between the touch signal line and the data line (see b+c in FIG. 3A), mainly determined by the process capability, generally ranging from 3.6 to 3.9 μm. In this example, it is 3.9 μm. According to the above formula, the values of L0 to L2, f, g, m, and n can be determined. That is, after determining the values of m and n, the value of L0 can be determined according to formula 3. Then, the value of L1 can be determined according to the determined values of f and g and formula 2. Finally, the value of L2 can be determined according to formula 1, thereby determining the distance between the signal lines.

According to existing technology, designing the touch signal line of the TPM metal layer and the touch signal line of the SD metal layer to have the same line width and face each other directly can often result in poor light leakage. According to the technical solution of this disclosure, the edges of the two layers of touch signal lines are designed to be staggered, that is, based on FIG. 2A, the touch signal line of the TPM metal layer is moved to the right, and is staggered with the edge of the touch signal line of the SD metal layer. After staggering the touch signal lines of the TPM metal layer, the distance between the touch signal lines of the TPM metal layer and the upper ITO (i.e. 2nd ITO shown in FIG. 2A) decreases, that is, the distance b shown in FIG. 2A decreases. In order to avoid the increase in overlapping capacitance caused by alignment fluctuations during actual fabrication, which can affect the driving frequency, the line width of the touch signal line of the TPM metal layer is reduced to increase the distance to the upper ITO.

Based on the current alignment ability (approximately 1.5 μm), if the SD metal layer is completely misaligned with the TPM metal layer, the edges need to be designed to be staggered by more than 1.65 μm, which has a significant impact on the opening rate of the product. Improving alignment ability can reduce the required staggered distance. If the alignment ability is increased to 0.35 μm, the required staggered distance can be reduced from 1.65 μm to 0.8 μm.

When designing, the wiring should be designed to be staggered by a certain distance (for example, staggered by less than 1.65 μm), which can reduce the probability of defects, but the defects cannot be completely avoided. The actual distance that can be staggered needs to be comprehensively considered based on various factors such as opening rate and IC driving capability. Therefore, the design of the black matrix was also optimized. As shown in FIG. 9, although the data lines are designed with unequal pitch, the opening width W of the black matrix is designed to be consistent, that is, the light-transmission area of each sub-pixel is consistent, and the distance of the black matrix wrapping the touch signal line (that is, the distance from the edge of the opening to the edge of the touch signal line) is above 3 μm (i.e., the distance C shown in FIG. 9 is above 3 μm) to further prevent poor light leakage. Considering the touch signal driving ability and opening rate requirements of the IC, the line width of the touch signal line (i.e., the upper touch signal line) of the TPM metal layer is designed to be 5.6 μm. The line width of the touch signal line (i.e., the lower touch signal line) of the SD metal layer is designed to be 6.0 μm. The edges of the upper touch signal line and the lower touch signal line should be staggered by 0.6 μm (i.e. distance d shown in FIG. 9), and the black matrix wraps the edge of the touch signal line by 3.25 μm (i.e. distance C as shown in FIG. 9).

This disclosure has already disclosed exemplary embodiments, and although specific terms are used, they are only used and should only be interpreted as general explanatory meanings, and are not intended for limiting purposes. In some embodiments, it is evident to those skilled in the art that unless otherwise explicitly stated, features, characteristics, and/or elements described in combination with specific embodiments may be used separately, or may be used in combination with features, characteristics, and/or elements described in combination with other embodiments. Therefore, those skilled in the art will understand that various changes in form and details may be made without departing from the scope of this disclosure as stated by the accompanying claims.

The invention claimed is:

1. An array substrate, comprising:
   a substrate;
   a plurality of gate lines and a plurality of data lines positioned on the substrate, wherein the plurality of gate lines extend along a first direction and are arranged in a second direction different from the first direction, the plurality of data lines extend in the second direction and are arranged in the first direction, the plurality of gate lines intersect with the plurality of data lines to define a plurality of pixel areas; and
   a plurality of touch signal lines positioned on the substrate, wherein the plurality of touch signal lines extend in the second direction, each of the plurality of touch signal lines comprises a lower touch signal line and an upper touch signal line, the lower touch signal line is positioned in a same layer as the plurality of data lines, the upper touch signal line is positioned above the lower touch signal line in a direction perpendicular to the array substrate;
   wherein each touch signal line is adjacent to one of the plurality of data lines, the lower touch signal line comprises a first lower edge and a second lower edge extending along the second direction, a distance from the first lower edge to the adjacent data line in the first direction is less than a distance from the second lower edge to the adjacent data line in the first direction,
   the upper touch signal line comprises a first upper edge and a second upper edge extending along the second direction, a distance from the first upper edge to the adjacent data line in the first direction is less than a distance from the second upper edge to the adjacent data line in the first direction, and
   a distance from the second upper edge of the upper touch signal line to the adjacent data line in the first direction is less than a distance from the second lower edge of the lower touch signal line to the adjacent data line in the first direction.

2. The array substrate according to claim 1, wherein a distance from the first upper edge of the upper touch signal line to the adjacent data line in the first direction is essentially the same as a distance from the first lower edge of the lower touch signal line to the adjacent data line in the first direction.

3. The array substrate according to claim 1, wherein a width of the upper touch signal line in the first direction is essentially the same as a width of the lower touch signal line in the first direction.

4. The array substrate according to claim 1, wherein a width of the upper touch signal line in the first direction is greater than a width of the lower touch signal line in the first direction.

5. The array substrate according to claim 1, further comprising a first overlapping electrode,
wherein the upper touch signal line and the lower touch signal line of each of the plurality of touch signal lines are electrically connected to each other via the first overlapping electrode.

6. The array substrate according to claim 5, wherein the array substrate comprises a display area and a non-display area adjacent to each other, and an upper via hole connected to the upper touch signal line and a lower via hole connected to the lower touch signal line are formed at positions of the non-display area close to the display area,
the first overlapping electrode is electrically connected to the upper touch signal line and the lower touch signal line via the upper via hole and the lower via hole, so that the upper touch signal line and the lower touch signal line are electrically connected to each other.

7. The array substrate according to claim 6, wherein the upper via hole and the lower via hole are aligned in the first direction.

8. The array substrate according to claim 6, wherein the plurality of touch signal lines comprise valid touch signal lines and dummy touch signal lines, and the dummy touch signal lines are electrically connected to a common signal line via the first overlapping electrode.

9. The array substrate according to claim 8, further comprising a plurality of touch electrodes, wherein the first overlapping electrode, the plurality of touch electrodes and the common signal line are arranged in a same layer, and each of the valid touch signal lines is electrically connected to one of the plurality of touch electrodes respectively in the display area.

10. The array substrate according to claim 6, wherein a plurality of touch signal leads, a plurality of upper source signal leads and a plurality of lower source signal leads are arranged in the non-display area, and the plurality of data lines comprise a plurality of first data lines and a plurality of second data lines,
the plurality of touch signal leads are arranged in a same layer as the upper touch signal lines of the plurality of touch signal lines, and are respectively connected and extended with the upper touch signal lines of the plurality of touch signal lines,
the plurality of upper source signal leads are arranged in a same layer as the lower touch signal lines of the plurality of touch signal lines, and are respectively connected and extended with the plurality of first data lines,
the plurality of lower source signal leads are positioned below the plurality of upper source signal leads in a direction perpendicular to the array substrate, and each of the plurality of lower source signal leads is electrically connected to one of the plurality of second data lines.

11. The array substrate according to claim 10, wherein the plurality of second data lines form, at positions of the non-display area close to the display area, a data line via hole connected to the second data line and a source line via hole connected to the lower source signal lead,
each of the plurality of lower source signal leads is electrically connected to one of the plurality of second data lines respectively via the source line via hole, a second overlapping electrode and the data line via hole, wherein the first overlapping electrode and the second overlapping electrode are arranged in a same layer.

12. The array substrate according to claim 1, wherein a distance between at least two adjacent data lines in the plurality of data lines is different from a distance between other adjacent data lines.

13. The array substrate according to claim 1, wherein the substrate comprises a first substrate, a gate insulating layer is arranged on the first substrate, the plurality of data lines and the lower touch signal lines of the plurality of touch signal lines are arranged on the gate insulating layer, and the array substrate further comprises a passivation layer formed on the gate insulating layer,
wherein the passivation layer covers the plurality of data lines and the plurality of touch signal lines.

14. The array substrate according to claim 13, further comprising a plurality of pixel electrodes, wherein the plurality of pixel electrodes are arranged in the plurality of pixel areas respectively, and the plurality of pixel electrodes are arranged in a same layer as the plurality of data lines and the lower touch signal lines of the plurality of touch signal lines, the passivation layer covers the plurality of pixel electrodes.

15. A touch display device, comprising an array substrate according to claim 1 and an opposite substrate opposite to the array substrate.

16. The touch display device according to claim 15, wherein the opposite substrate comprises a black matrix layer, a portion of the pixel area exposed by the black matrix layer is an opening area, a distance from the second upper edge of the upper touch signal line to an edge of the opening area in the first direction is greater than a distance from the second lower edge of the lower touch signal line to the edge of the opening area in the first direction.

17. The touch display device according to claim 16, wherein a distance from the edge of the opening area to the second upper edge of the upper touch signal line is greater than or equal to 3 μm.

18. A preparation method of an array substrate according to claim 1, comprising:
preparing a substrate;
preparing a plurality of gate lines and a plurality of data lines on the substrate, wherein the plurality of gate lines extend along a first direction and are arranged in a second direction different from the first direction, the plurality of data lines extend in the second direction and are arranged in the first direction, the plurality of gate lines intersect with the plurality of data lines to define a plurality of pixel areas; and
preparing a plurality of touch signal lines on the substrate, wherein the plurality of touch signal lines extend in the second direction, each of the plurality of touch signal lines comprises a lower touch signal line and an upper touch signal line, the lower touch signal line is positioned in a same layer as the plurality of data lines, the upper touch signal line is positioned above the lower touch signal line in a direction perpendicular to the array substrate;
wherein each touch signal line is adjacent to one of the plurality of data lines, the lower touch signal line comprises a first lower edge and a second lower edge extending along the second direction, a distance from the first lower edge to the adjacent data line in the first direction is less than a distance from the second lower edge to the adjacent data line in the first direction, the upper touch signal line comprises a first upper edge and a second upper edge extending along the second direction, a distance from the first upper edge to the adjacent data line in the first direction is less than a distance from the second upper edge to the adjacent data line in the first direction, and a distance from the second upper edge of the upper touch signal line to the adjacent data line in the first direction is less than a distance from the second lower edge of the lower touch signal line to the adjacent data line in the first direction.

19. The touch display device according to claim 15, wherein a distance from the first upper edge of the upper touch signal line to the adjacent data line in the first direction is essentially the same as a distance from the first lower edge of the lower touch signal line to the adjacent data line in the first direction.

20. The touch display device according to claim 15, wherein a width of the upper touch signal line in the first direction is essentially the same as a width of the lower touch signal line in the first direction.

\* \* \* \* \*